United States Patent
Ogasawara

(10) Patent No.: US 7,270,921 B2
(45) Date of Patent: Sep. 18, 2007

(54) PATTERN WRITING AND FORMING METHOD

(75) Inventor: Munehiro Ogasawara, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1058 days.

(21) Appl. No.: 10/360,801

(22) Filed: Feb. 10, 2003

(65) Prior Publication Data

US 2003/0151003 A1    Aug. 14, 2003

(30) Foreign Application Priority Data

Feb. 8, 2002    (JP)    ............... 2002-031951

(51) Int. Cl.
*G03C 5/00*    (2006.01)
*G03F 9/00*    (2006.01)

(52) U.S. Cl. ................ 430/30; 430/296; 430/313; 430/396; 430/942

(58) Field of Classification Search ............ 430/30, 430/296, 313, 396, 942
See application file for complete search history.

(56) References Cited

FOREIGN PATENT DOCUMENTS

| JP | 10-10701 | 1/1998 |
|---|---|---|
| JP | 11-204415 | 7/1999 |
| JP | 3074675 | 8/2000 |

OTHER PUBLICATIONS

Munehiro Ogasawara, et al. "Reduction of Long Range Fogging Effect in a High Acceleration Voltage Electron Beam Mask Writing System" J. Vac. Sci. Technol. B 17(6), Nov./Dec. 1999, pp. 2936-2939.

*Primary Examiner*—Christopher G. Young
(74) *Attorney, Agent, or Firm*—Oblon, Spivak, McClelland, Maier & Neustadt, P.C.

(57) ABSTRACT

A pattern forming method is proposed for easy correction of a pattern-size variation occurring in an etching process. An energy beam is radiated onto a resist-applied target while the energy beam is adjusted to correct the pattern-size variation occurring in the etching process. The resist on the target is developed to form a resist pattern. The target is etched with the resist pattern as a mask, thus forming patterns thereon.

14 Claims, 10 Drawing Sheets

PATTERN WRITING AND FORMING METHOD

CROSS REFERENCE TO RELATED APPLICATIONS

This application is based upon and claims the benefit of priority from the prior art Japanese Patent Application No. 2002-31951 filed on Feb. 8, 2002, the entire contents of which are incorporated by reference.

BACKGROUND OF THE INVENTION

The present invention relates to a method of writing patterns and also a method of forming patterns.

Electron beams are superior to light beams in forming fine patterns, for example, on sample semiconductor devices. Moreover, electron-beam pattern formation creates masks for optical lithography.

FIG. 1 illustrates an electron-beam writing system.

Electron beams emitted by an electron gun 1 are converged by a convergent lens 2 and radiated onto a first image-forming aperture 3. An image on the aperture 3 is projected on a second image-forming aperture 5 via a projection lens 4.

Provided inside the projection lens 4 is a deflector 6 that adjusts the location of the image on the second aperture 5, that has originally been formed on the first aperture 3, thus producing rectangular or triangular beams of required size.

The image formed on the second aperture 5 is scaled down by an objective lens 7 and projected on a target reticle mask 8, for example.

Electron beams radiated onto the reticle mask 8 are deflected to the center of a sub-deflection zone 11 by a high-precision main deflector 9. The beams are subjected to fine positional adjustments in the sub-deflection zone 11 by a high-speed sub-deflector 10.

On the reticle mask 8, the electron beams travel over frames 12 by stage step movements while on each frame 12 by stage continuous movements. These movements are performed alternately.

Discussed below is a proximity effect, or pattern-size errors, observed in the electron-beam writing system.

As illustrated in FIG. 2, electrons 14 incident to a target 13 are scattered therein and generate secondary electrons. A resist 16 formed on the target 13 is exposed to backscattering electrons 15 among the secondary electrons and scattering electrons. This results in background exposure in addition to exposure by the incident electrons. The region of the resist 16 to be exposed is, for example, about 10 µm in radius under a 50 KeV-writing system.

The exposure of the resist 16 to the backscattering electrons 15 depends on pattern density. Moreover, the pattern size after resist development depends on exposure to the incident electrons 14 and also the backscattering electrons 15. Therefore, the pattern size after development varies in accordance with a pattern density.

This pattern-size variation is called a proximity effect. The proximity effect is also caused by unfocused beams or scattering of electrons in a resist.

Discussed further is a long-range fogging exposure which also causes pattern-size errors, observed in the electron-beam writing system.

When electrons 14 are incident to the target 13, as illustrated in FIG. 3, some of the electrons 14 and also secondary electrons are emitted from the target 13 and return to the lower surface 18 of the objective lens 17.

The returned electrons are reflected at the lower surface 18 as reflected electrons 19. The resist 16 is further exposed to the reflected electrons 19, which is background exposure.

This phenomenon is called a long-range fogging exposure. This exposure covers the region of several tens of millimeters from a beam-radiated point on the target 13. A large variation in average amount of beams radiated on the target 13 within about several millimeters thus causes a large variation in resist pattern size after development.

Moreover, a pattern-size variation is caused for patterns etched on the target 13 using a resist pattern as a mask, due to unsteady advancement of etching mainly depending on a pattern density. This phenomenon is called a loading effect.

The pattern-size variation due to the loading effect largely depends on a resist pattern density.

SUMMARY OF THE INVENTION

Under consideration of the problems discussed above, a purpose of the present invention is to provide a pattern writing method and also a pattern forming method that provide constant pattern size with correction of beam radiation amounts independent of pattern density.

A pattern writing method as a first aspect of the present invention for radiating an energy beam on a resist that is applied to a target to write patterns thereon comprises: storing pattern data for writing the patterns, the pattern data including a reference radiation amount $D_0$ for radiating the energy beam, a distribution of a pattern dependency of a pattern-size variation $\Delta$ due to a loading effect, and an energy distribution "s" applied to the resist by the energy beam; dividing writing regions of the target into grids to provide sub-writing regions in the grids; obtaining a distribution of a pattern-area density per sub-writing region based on the pattern data; calculating a radiation amount $DC_f(x)$ for correcting long-range fogging exposure in each sub-writing region based on the pattern-area density and the reference radiation amount $D_O$; calculating a radiation amount $DC_p(x)$ for correcting a proximity effect applied to those of the patterns in each sub-writing region based on the pattern data and the reference radiation amount $D_0$; calculating a radiation amount $D(x)$ based on the radiation amount $DC_f(x)$, the radiation amount $DC_p(x)$, the distribution of a pattern dependency and the energy distribution "s"; and deciding a radiation location and a radiation shape of the energy beam based on data on a pattern location and a pattern shape for each of the patterns in the sub-writing regions; and radiating the energy beam on the radiation location on the target with the radiation shape for a period in which a radiated energy level from the energy beam reaches the radiation amount $D(x)$.

The pattern writing method may include obtaining a distribution of a pattern-size variation $\Delta(x)$ per sub-writing region based on the distribution of the pattern-area density and the distribution of the pattern dependency of the pattern-size variation $\Delta$ due to the loading effect, wherein the step of calculating the radiation amount $DC_f(x)$ is calculated based on the distribution of the pattern-area density, the reference radiation amount $D_0$, and the distribution of the pattern-size variation $\Delta(x)$; wherein the step of calculating the radiation amount $DC_p(x)$ is calculated based on the data on the pattern location and the pattern shape in the sub-writing regions, the reference radiation amount $D_0$, the distribution of the pattern-size variation $\Delta(x)$, and the energy distribution "s" of the energy beam.

The step of calculating the radiation amount D(x) may include generating a product of the radiation amount $DC_f(x)$ and the radiation amount $DC_p(x)$.

The step of calculating the radiation amount D(x) may use the radiation amount $DC_f(x)$ set to the reference radiation amount $D_0$.

The step of calculating the radiation amount D(x) may use an equation $D(x)=DC_p(x) \times DC_f(x)/(1+(2s(\Delta)-1) \times (DC_p(x) \times DC_f(x)/C_0))$.

The pattern-size variation $\Delta$ may involve an unstable etching speed in addition to the loading effect.

The step of calculating the radiation amount D(x) may use the radiation amount $DC_f(x)$ set to the reference radiation amount $D_0$.

Moreover, a pattern forming method as a second aspect of the present invention comprises: storing pattern data for writing patterns, the pattern data including a reference radiation amount $D_0$ for radiating an energy beam on a resist-applied target, a distribution of pattern dependency of a pattern-size variation $\Delta$ due to a loading effect and an energy distribution "s" applied to the resist by the energy beam; dividing writing regions of the target into grids to provide sub-writing regions in the grids; obtaining distribution of a pattern-area density per sub-writing region based on the pattern data; calculating a radiation amount $DC_f(x)$ for correcting long-range fogging exposure in each sub-writing region based on the pattern-area density and the reference radiation amount $D_0$; calculating a radiation amount $DC_p(x)$ for correcting proximity effect applied to those of the patterns in each sub-writing region based on the pattern data and the reference radiation amount $D_0$; calculating a radiation amount D(x) based on the radiation amount $DC_f(x)$, the radiation amount $DC_p(x)$, the distribution of a pattern dependency, and the energy distribution "s"; deciding radiation locations and radiation shapes of the energy beam based on data on pattern locations and pattern shapes of the patterns in the sub-writing regions and radiating the energy beam on the radiation locations on the target with the radiation shapes for a period in which a radiated energy level from the energy beam reaches the radiation amount D(x), thus writing the patterns on the resist; developing the pattern-written resist to form a resist pattern; and etching the target with the resist pattern as a mask, thus forming the patterns on the target.

The loading effect is change in etching progress mainly depending on a pattern density in formation of patterns on a target with etching using a resist pattern as a mask.

DETAILED DESCRIPTION OF EMBODIMENTS

The inventor of the present invention has studied electron-beam exposure under consideration of the loading effect, which is discussed below, before disclosure of embodiments according to the present invention.

Figure 1:
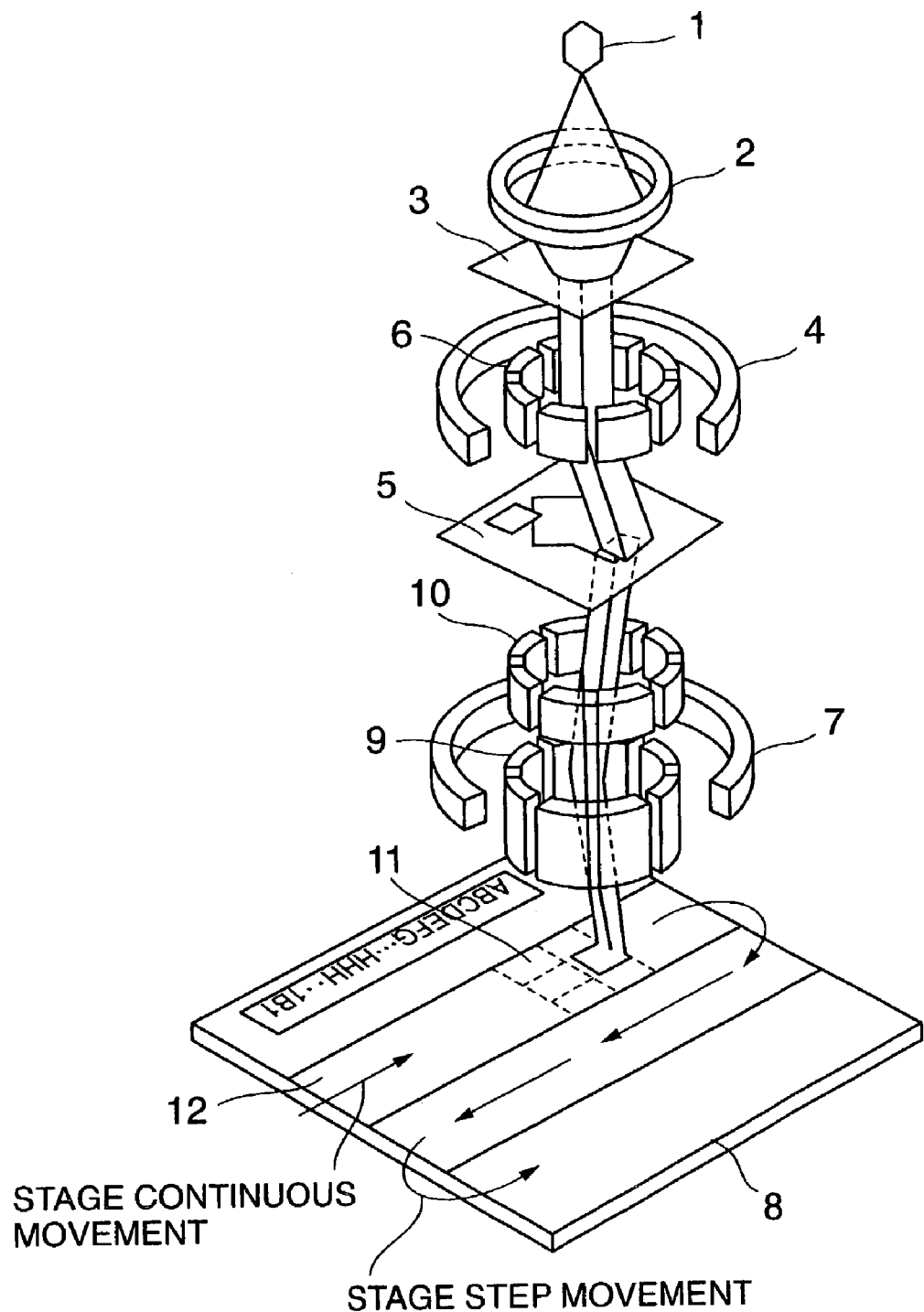
FIG. 1 is an illustration of an electron-beam writing system.
Figure 2:
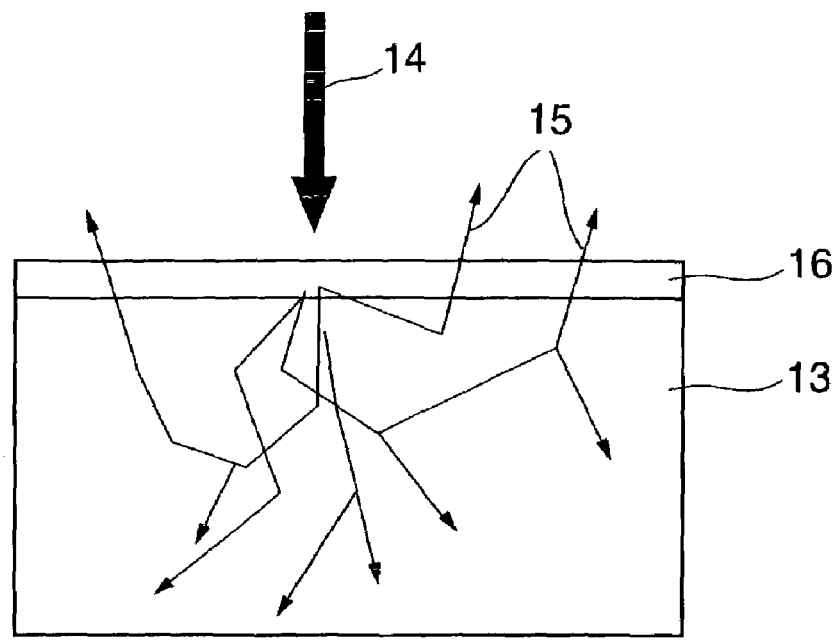
FIG. 2 is a cross sectional view of a substrate illustrating a proximity effect.
Figure 3:
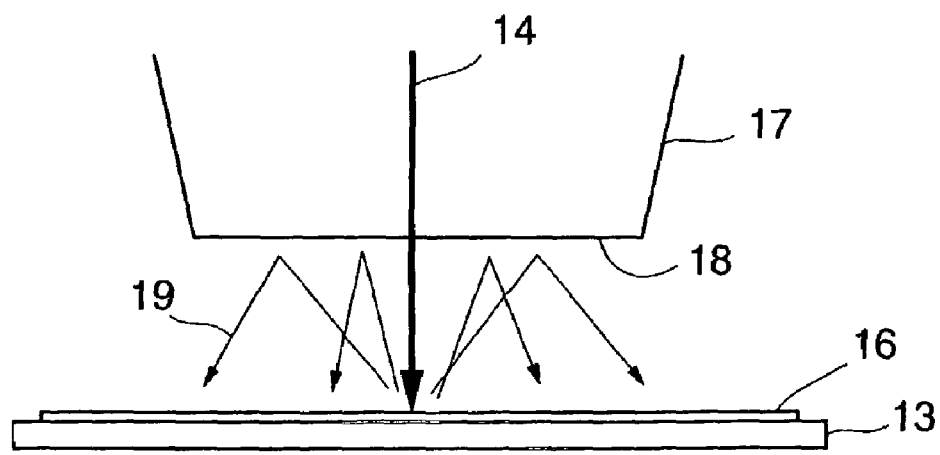
FIG. 3 is an illustration of a long-range fogging exposure.
Figure 4:
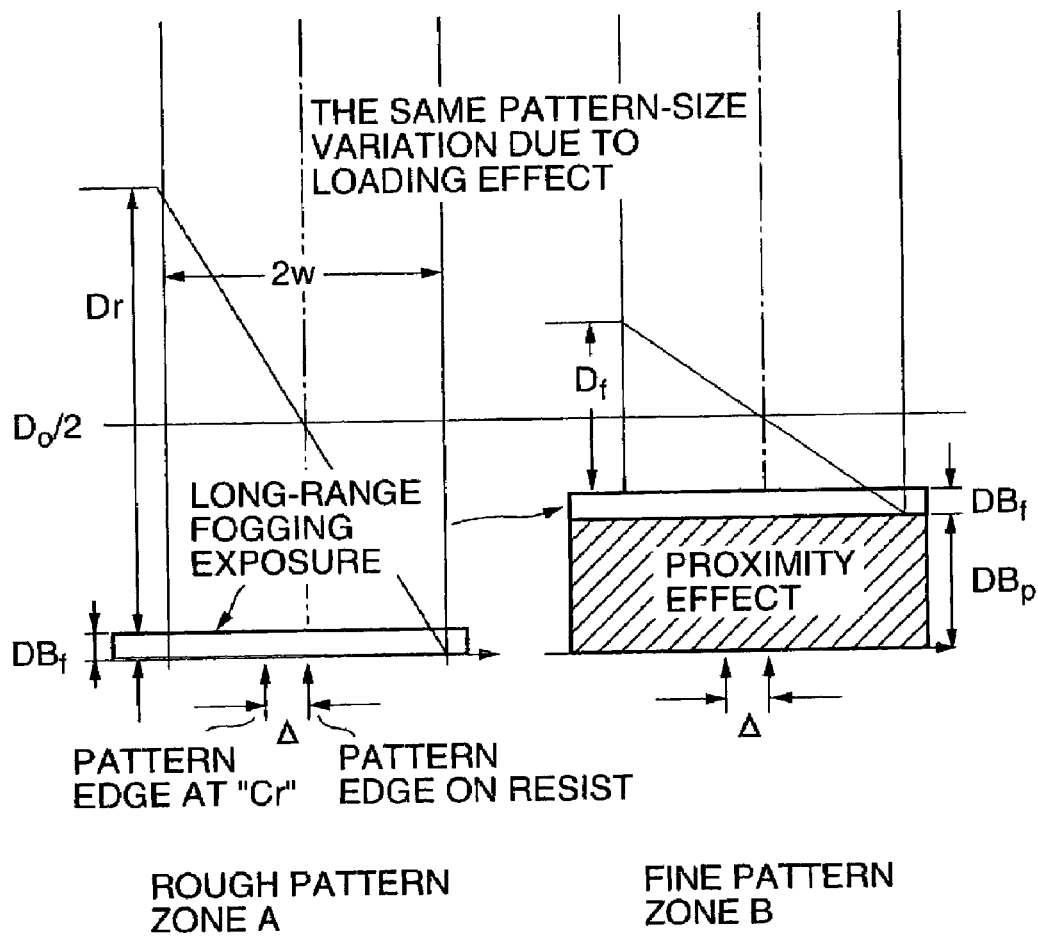
FIG. 4 is an illustration of a loading effect.

Illustrated in FIG. 4 is energy distribution at pattern edges on a resist given by an electron-beam spot under an electron-beam writing system.

It is assumed that the energy distribution at pattern edges is a linear distribution in the following discussion, for easy understanding.

Adjustments are made to a rough pattern zone A and a fine pattern zone B under consideration of the proximity effect, but ignoring the loading effect. These two pattern zones are located close to each other as equally subjected to the long-range fogging exposure under the discussion.

In FIG. 4, "Dr" denotes the amount of beam radiation on the rough pattern zone A, "$DB_f$" denotes the amount of beam radiation in background exposure due to the long-range fogging exposure, "Df" denotes the amount of beam radiation on the fine pattern zone B, and "$DB_p$" denotes the amount of beam radiation in the background exposure due to the proximity effect.

Based on the premise that the rough and fine pattern zones A and B are located close to each other as equally subjected to the long-range logging exposure, the radiation amount in background exposure due to the long-range fogging exposure in the fine pattern zone B is "$DB_f$" which is equal to that in the rough pattern zone A. The proximity effect is ignored on the rough pattern zone A under the discussion.

In FIG. 4, "w" is a value one-half of the spread of an energy distribution of incident electrons applied to the resist at pattern edges. In other words, this value is about one-half of the energy of unfocused electron-beam spot. The center of the spread of the energy distribution, or the point that is one-half of a reference radiation amount $D_0$ corresponds to a pattern edge.

The radiation amounts "Dr" and "Df" on the rough and fine pattern zones A and B, respectively, are decided so as to satisfy the following equations:

$$0.5Dr + DB_f = 0.5D_0$$

$$0.5Df + DB_p + DB_f = 0.5D_0$$

The radiation amounts "$DB_p$" and "$DB_f$" in the background exposure to correct the proximity effect and long-range fogging exposure, respectively, are given with integration on the entire mask surface, as follows:

$$DB_p = \eta \int \sigma(x-x')D(x')dx'$$

$$DB_f = \theta \int p(x-x')D(x')dx'$$

where "D(x)" denotes a radiation amount of incident electrons at a point "x", "$\eta$" and "$\theta$" are parameters indicating the effects of proximity effect and long-range fogging exposure, respectively, the function "$\sigma(x)$" to be subjected to integration indicates the spread of the proximity effect and the function "p(x)" to be subjected to integration indicates the spread of the long-range fogging exposure.

A radiation correction amount "$DC_a$" is then added for the rough and fine pattern zones A and B to correct the loading effect equally applied to these zones. This addition is based on the premise that the loading effect is equally applied to the zones A and B.

It is assumed that the pattern size in the rough pattern zone A has been adjusted by a size variant "$\Delta$" with addition of the radiation correction amount "$C_a$" for correcting the loading effect.

Figure 5:
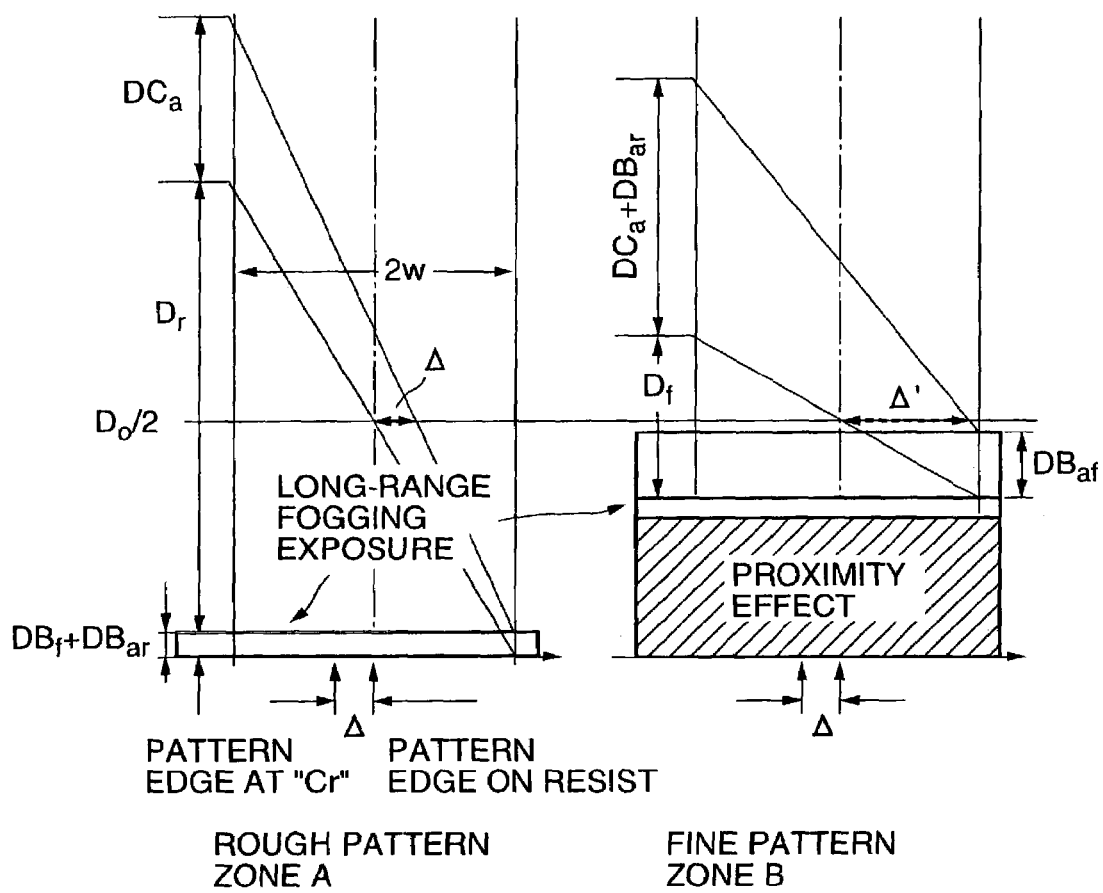
FIG. 5 is an illustration of a known method of correcting the loading effect.

In detail, a point at which the "$C_a$"-added radiation amount in the rough pattern zone A is one-half of the reference radiation amount $D_0$ is shifted by "$\Delta$" in the right direction in FIG. 5 farther than another point at which a radiation amount in the zone A before addition of "$C_a$" is one-half of the amount $D_0$.

This is achieved with a radiation correction amount "$DC_a$" that satisfies the following equation:

$$(Dr+DC_a)(w-\Delta)/2w+(1+DC_a/DC_{mf})DB_f=0.5D_0$$

where "$DC_{mf}$" denotes an average amount of beam radiation on an integrated region given the radiation amount "$DB_f$" in the background exposure due to the long-range fogging exposure.

Then, the following equation is established with a size variant "$\Delta'$" obtained by addition of the radiation correction amount "$DC_a$" for the fine pattern zone B to correct the loading effect.

$$(Df+DC_a)(w-\Delta')/2w+$$
$$(1+DC_a/Df)DB_p+(1+DC_a/DC_{mf})DB_f=0.5D_0$$

The size variant "$\Delta'$" for the fine pattern zone B will be larger than the size variant "$\Delta$" for the rough pattern zone A, as shown in FIG. 5, under the following equations:

$$DBar=(DC_a/DC_{mf})DB_f$$

$$DBaf=(DC_a/Df)DB_p+(DC_a/DC_{mf})DB_f$$

where "DBar" and "DBaf" denote an increment of beam radiation in the background exposure.

The size variant "$\Delta'$" for the fine pattern zone B will be in the range from "$\Delta$" to "$3\Delta$" under the condition that $DB_p=Df/3$, $\Delta \ll w$ and the radiation amount "$DB_f$" in the background exposure due to the long-range fogging exposure is ignored. In other words, the size variant "$\Delta'$" for the fine pattern zone B is about three times the size variant "$\Delta$" for the rough pattern zone A.

The results teach that accurate pattern adjustments cannot be made with the radiation correction amount decided in accordance with uniform correction dose for loading effect correction only.

Embodiments according to the present invention will be disclosed with reference to the attached drawings, although the invention being not limited to the embodiments and several modifications being available.

Figure 6:
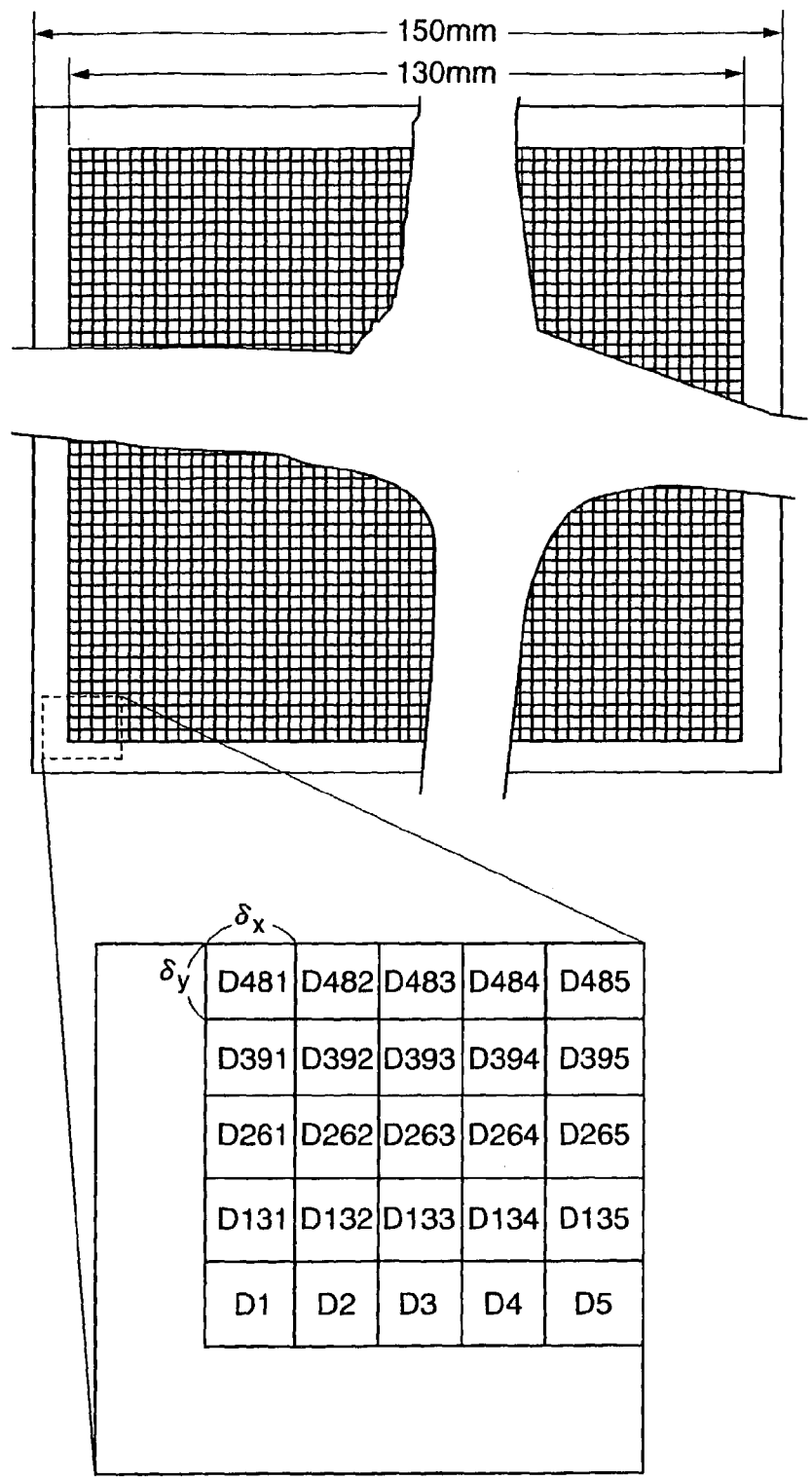
FIG. 6 is an illustration of target division in an embodiment according to the present invention.

FIG. 6 illustrates an electron-beam pattern writing on a 150 mm-square glass mask.

The glass mask (target) is divided into grids (sub-writing regions) each having a width "$\delta_x$" and a length "$\delta_y$" ("$\delta_x$" and "$\delta_y$" being 1 mm or less).

The width "$\delta_x$" and the length "$\delta_y$" may be a fraction of a typical pattern-size variant (about 10 mm) due to the long-range fogging exposure.

In detail, the grid size is preferably an integral multiple of an electron-beam deflecting region for higher exposing efficiency. This is a better choice for grids larger than the deflecting regions. For example, each grid size may be 1000 μm=1 mm against a 500-μm-square deflecting region. The number of 1-mm-square girds is then 130×130=16900 to a 130 mm-square writing region on the 150 mm-square glass mask.

The electron-beam deflecting region is (1 mm×1 mm) square in the following discussion.

A radiation amount D(x) per shot is decided so as to satisfy the following equation (1) for correction of the proximity effect, the long-range fogging exposure and the loading effect.

$$0.5D(x)(w-\Delta(x))/w+ \quad (1)$$
$$\eta \int \sigma(x-x')D(x')dx' + \theta \int p(x-x')D(x')dx' = 0.5D_0$$

where "x" and "x'" indicate two-dimensional vectors.

In the equation (1), "$\eta$" and "$\theta$" denote parameters indicating the effects of the proximity effect and the long-range fogging exposure, respectively. The terms $\sigma(x)$ and $p(x)$ denote the functions giving the spread of the proximity effect and long-range fogging exposure, respectively. These parameters and functions are experimentally obtained beforehand. Moreover, $\Delta(x)$ in the equation (1) gives pattern-size variation due to the loading effect.

One premise in this discussion is that no pattern-size variation due to the loading effect occurs within a region of about 1-mm square. The spread of the proximity effect $\sigma(x)$ is about several ten micrometers whereas that of the long-range fogging exposure $p(x)$ is about several millimeters.

The integration range in the left side of the equation (1) covers patterning zones over the mask surface. Nonetheless, in actual use, the integration range in the first integration involving $\sigma(x-x')$ may be limited to a region having a radius of about several 10 micrometers with a point "x" at the center. Moreover, the integration range in the second integration involving $p(x-x')$ in actual use may be limited to a region having a radius of about 30 mm with a point "x" at the center.

The proximity effect and the long-range fogging exposure can be corrected with the following equations:

$$0.5DC_p(x)DC_f(x)(w-\Delta(x))/w+\eta DC_f(x)\int \sigma(x-x')DC_p(x')dx' + \quad (2)$$
$$\theta \int p(x-x')DC_p(x')DC_f(x')dx'=0.5D_0$$

which is an approximate expression of the equation (1).

The equation (2) is established under the condition that variation in the radiation amount $DC_f(x)$ for correcting the long-range fogging exposure is milder than that in the radiation amount $DC_p(x)$ for correcting the proximity effect in the equation $D(x)=DC_p(x) \times Dc_f(x)$.

The radiation amount $Dc_p(x)$ for correcting the proximity effect is decided so that it satisfies the following equation (3):

$$0.5DC_p(x) + \eta w/(w - \Delta(x)) \int \sigma(x - x')DC_p(x')dx' = 0.5 \quad (3)$$

The equation (3) gives the following equation (4):

$$0.5DC_f(x) + \theta w/(w - \Delta(x)) \int p(x - x')DC_p(x')DC_f(x')dx' = \quad (4)$$
$$0.5w/(w - \Delta(x))D_0$$

The integration in the equation (4) will not produce large errors even under the condition that the radiation amount $DC_f(x)$ for correcting the long-range fogging exposure is constant in a 1 mm-square region to be subjected to integration.

The term involving integration in the equation (4) for the 1 mm-square region is given as follows:

$$\theta w/(w - \Delta(x)) \times \Sigma p(x - xj)DC_f(x_j) \int_j DC_p(x)dx'$$

where "j" denotes a region, $\int_j$ means an integration within the region j, and the term involving integration in the equation (4) is expressed as addition of terms each involving integration for one region.

Integration of the both sides of the equation (3) in such a 1-mm-square region j having patterns gives the second term in the left side of the equation (3) the following double two-dimensional spatial integration:

$$\int_j \int \sigma(x - x')DC_p(x - x')DC_p(x')dx'dx$$

In this integration, $\int_j \sigma(x - x')dx$ is discussed. The value given by the integration will vary in accordance with how many patterns exist in a region having a position x' as the center. In other words, when x' is within the region j, $\int_j \sigma(x - x')dx$ can be approximated to about 1 without respect to the position x' if pattern density is high in this region.

Under the premise, the first-order approximation gives 1, which then leads to the following integration:

$$\int_j DC_p(x')dx'$$

A 1-mm-square region "j" to be subjected to integration at "x" gives the following equation:

$$(0.5 + \eta w/(w - \Delta(x_i))) \int_j DC_p(x')dx' = 0.5 \times (\text{patterning area in region j})$$

which further gives the following equation:

$$\int_j DC_p(x')dx' 0.5 \times (\text{patterning area in region } j)/(0.5 + \eta w/(w - \Delta(x_i)))$$

Then, the equation (4) is converted into the following equation (5) for a region "i":

$$0.5DC_f(x_i) + \theta w/(w - \Delta(x_i))/(0.5 + \eta w/(w - \Delta(x))) \quad (5)$$
$$\sum p(x_i - x_j)DC_f(x_j) \times 0.5 \times (\text{patterning area in region } j) =$$
$$0.5w/(w - \Delta(x_i))D_0$$

The equation (5) is applied to all regions over the mask surface to obtain $DC_f(x_i)$.

For further accurate approximation, a pattern density $e_j$ in the region "j" may be defined as $e_j$=(pattern area in region j)/(area in region j) for approximation of $\int \sigma(x - x')dx$ to $e_j$. This gives the following equation:

$$(0.5 + e_j \eta w/(w - \Delta(x_j))) \int DC_p(x')dx' = 0.5 \times (\text{patterning area in region j})$$

Then, the equation (4) is converted into the following equation that is little bit different from the equation (5):

$$0.5DC_f(x_i) + \quad (5')$$
$$\theta w/(w - \Delta(x_i)) \sum 1/(0.5 + e_j \eta w/(w - \Delta(x)))p(x_i - x_j)DC_f(x_j) \times$$
$$0.5 \times (\text{patterning area in region } j) = 0.5w/(w - \Delta(x_i))D_0$$

It is also possible to achieve higher calculation accuracy of the equation (4) with $DC_p(x)$ accurately obtained from the equation (3) or through appropriate approximation.

The total sum $\Sigma$ in the equation (5) not all regions but only for regions within a radius of, for example, 30 mm from a region including "$X_i$" makes easy the total calculation. This is because the mask is larger than the spread of p(x).

In the method disclosed so far((5),(5')), $DC_f(X_i)$ requires no fine pattern distributions required for the proximity-effect correction if the parameters $\eta$ and $\theta$ indicating the proximity effect and the long-range fogging exposure, respectively, and also a pattering area of each region are given.

All of the proximity effect, the long-range fogging exposure and the loading effect can be corrected by the following procedure: a radiation amount $DC_f(x)$ for correcting the long-range fogging exposure is obtained beforehand; and a radiation amount $DC_p(x)$ for correcting the proximity effect in regions near the region to be exposed is calculated at exposure, which is then multiplied by $DC_f(x)$ in the region to be exposed.

The dependency of a size variation $\Delta$, due to the loading effect, on a pattern density is given by etching resist patterns of different pattern densities.

The simplest liner distribution is employed as the effective radiation-amount distribution in the discussion so far.

Another type of the distribution can of course be employed as the effective radiation-amount distribution.

For example, it is assumed that u=0 at a pattern edge in one dimension where "u" denotes a pattern variation $\Delta$ due to the loading effect. Also it is assumed that the radiation-amount distribution is given by $D(x) \times s(u)$ where s(0)=0.5, s($\infty$)=0 and s($-\infty$)=1.

The former example (linear distribution) is given under the condition $s(u)=0.5 \times (w-u)/w$ where $-w \leq x \leq w$, s(u)=1 where u<-w and s(u)=0 where u>w.

The equation (1) for the radiation amount D(x) under the method already disclosed is expressed as follows:

$$D(x)s(\Delta) + \eta \int \sigma(x - x')D(x') + \theta \int p(x - x')D(x')dx' = 0.5D_0 \quad (6)$$

Then, $D(x) = DC_p(x) \times DC_f(x)$, like the former disclosure, gives the following equations:

$$DC_p(x) + \eta (1/s(\Delta)) \int \sigma(x - x')DC_p(x')dx' = 0.5 \quad (7)$$

$$0.5DC_f(x) + \theta (1/s(\Delta)) \int p(x - x')DC_p(x')DC_f(x') dx' = 0.5$$
$$(1/s(\Delta))D_0 \quad (8)$$

The equations (7) and (8) give the radiation amount $DC_p(x)$ for correcting the proximity effect and also the radiation amount $DC_f(x)$ for correcting the long-range fogging exposure.

Spot-beam energy distribution $s(\Delta)$ applied to a resist can be experimentally obtained with the dependency of variation in resist pattern size on the amount of beam radiation. For example, the distribution $s(\Delta)$ can be obtained with parameters given through test pattern writing using an adequate function such as an error function.

Provided is an array of rectangular patterns separated from one another at regular intervals. A region sufficiently lager than that affected by the proximity effect but smaller than that affected by the loading effect, for example, a 200-micron-square zone is set in the center region of the array.

Straight patterns of different densities are written in an about 100-micron-zone in the center region of the array, with correction of the proximity effect and the long-range scatter exposure.

A typical value of the developed pattern-size variation is set to a pattern-size variation $\Delta$ due to the loading effect with respect to the peripheral pattern density. It is preferably set to a pattern-size variation $\Delta$ averaged near the most important density in the center pattern.

Figure 8:
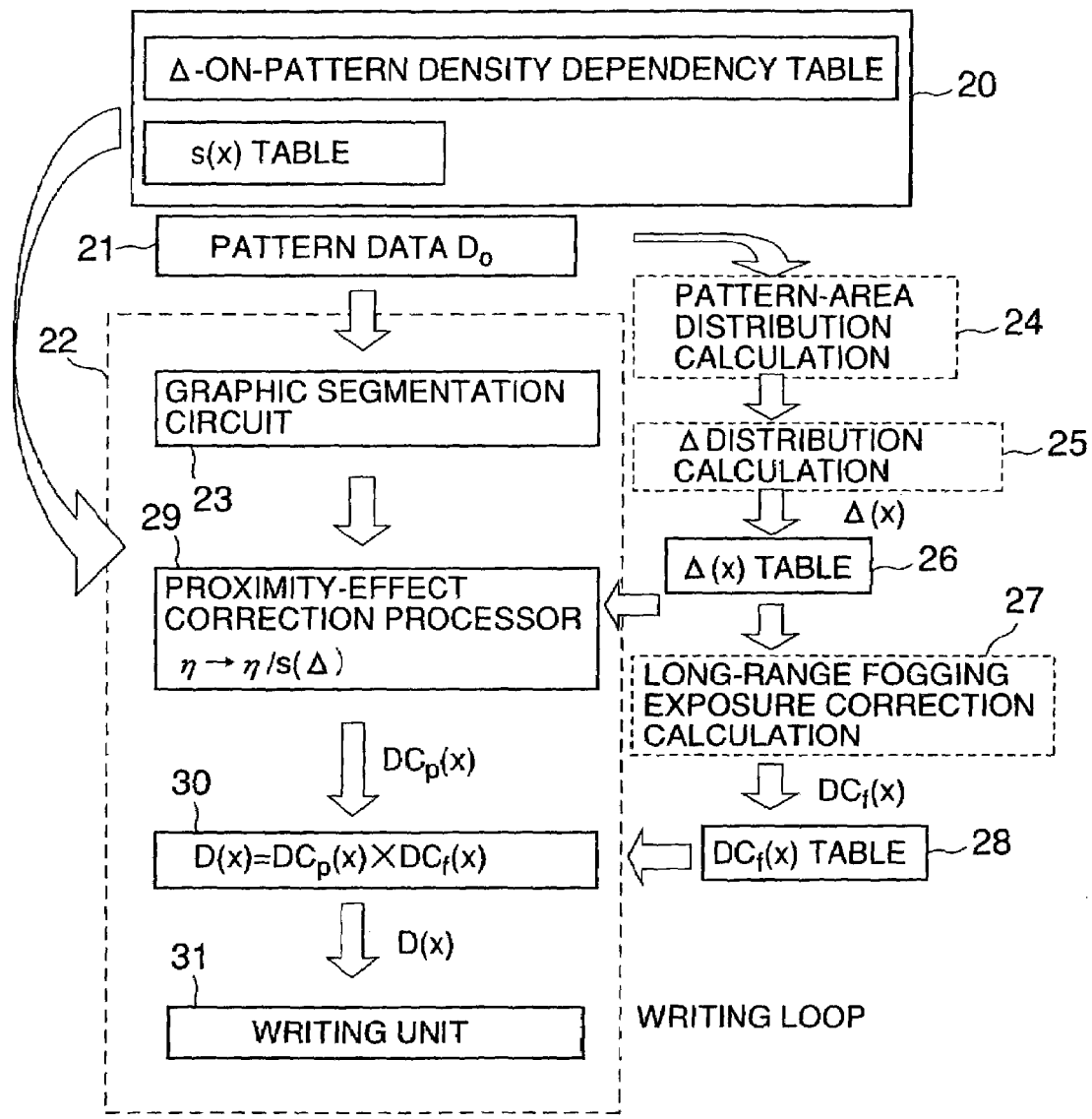
FIG. 8 is a flowchart of procedures in an embodiment according to the present invention.

FIG. 8 shows system architecture to achieve the correction procedure disclosed above.

Stored first in a system memory 20 is a table of a dependency of pattern-size variation $\Delta$ due to the loading effect on a pattern-area density and another table of a function $s(x)$ indicating energy-beam distribution.

Stored next in a memory 21 of a data processor are pattern data and a reference radiation amount $D_0$.

The entire writing region is divided into 1-mm-square grids (sub-writing regions) and a pattern-area density is obtained per sub-writing region by a calculator 24 based on the pattern data stored in the memory 21.

The distribution $\Delta(x)$ of the pattern-size variation $\Delta$ due to the loading effect is obtained by a calculator 25 based on the pattern-area density distribution and the dependency of the pattern-size variation $\Delta$ on the pattern-area density stored in the memory 20. A table of the pattern-size variation distribution $\Delta(x)$ is then stored in a memory 26.

The pattern-area density, the pattern-size variation distribution $\Delta(x)$ due to the loading effect and the reference radiation amount $D_0$ are applied to the equation (8) at a long-range fogging exposure correction computer 27, to give the radiation-amount distribution $DC_f(x)$ for correcting the long-range fogging exposure. A table of $DC_f(x)$ is stored in a memory 28.

In a writing system 22, the data processor retrieves pattern data for each sub-writing region from the memory 21. The retrieved pattern data are sent to a graphic segmentation circuitry 23.

Data on location and shape of divided small graphics for each sub-writing region are sent from the graphic segmentation circuitry 23 to a proximity-effect correction processor 29.

The proximity-effect correction processor 29 performs the following procedures:

sending the location data in each sub-writing region to the memory 26, stored in which is the pattern-size variation distribution $\Delta(x)$ due to the loading effect;

retrieving data of the pattern-size variation distribution $\Delta(x)$ corresponding to each sub-writing region from the memory 26;

sending the data of the pattern-size variation distribution $\Delta(x)$ to the memory 20, stored in which the functions $s(x)$ indicating the energy distribution applied to the resist by an energy beam, and retrieving the corresponding data of $s(\Delta(x))$; and calculating a radiation amount $DC_p(x)$ based on a proximity-effect correction for small graphics in each sub-writing region using the equation (7), the calculated radiation amount $DC_p(x)$ being sent to an a calculator 30.

The calculator 30 retrieves data of the radiation amount $DC_f(x)$ for correcting the long-range fogging exposure, corresponding to each sub-writing region, from the table of $DC_f(x)$ stored in the memory 28.

Then, the calculator 30 calculates the final data of beam radiation amount after correction $D(x)=DC_p(x) \times DC_f(x)$. The final data and the data on the locations and shapes of the divided small graphics are sent to a writing unit 31.

The writing unit 31 decides radiation points and shapes of electron beams based on the data on the locations and shapes of the divided small graphics for each sub-writing region. Then, the writing unit 31 radiates electron beams onto a target for a period corresponding to the radiation amount $D(x)$.

The procedure is repeated until the writing process completes on all small graphics in one sub-writing region. On completion of the writing process in one sub-writing region, the procedure moves onto the next sub-writing region.

The long-range fogging exposure can be ignored depending on system type and required specification. This allows omission of the process of obtaining the radiation amount $DC_f(x)$ for correcting the long-range fogging exposure, thus $D(x)=DC_p(x) \times D_0$ being given.

The parameter indicating the proximity effect in the proximity-effect correction calculation in the above method is not $\eta$ but $\eta w/(w-\Delta(x))$ which takes a particular value per grid.

Nevertheless, the parameter $\eta$ for proximity-effect correction, constant over the mask surface, provides a simple system architecture with high computation speed and simple architecture for the proximity-effect correction processor 29.

The parameter $\eta$ constant over the mask surface allows the following procedures:

A radiation amount $D(x)$ per shot is decided so as to satisfy the following equation (9) for correction of the proximity effect and long-range fogging exposure (the loading effect being ignored).

$$0.5D(x)+\eta \int \sigma(x-x')D(x')dx'+\theta \int p(x-x')D_d(x)dx'=0.5D_0 \qquad (9)$$

where "x" and "x'" indicate two-dimensional vectors.

In the equation (9), "$\eta$" and "$\theta$" denote parameters indicating the effects of the proximity effect and the long-range fogging exposure, respectively. The terms $\sigma(x)$ and $p(x)$ denote the functions that give the spread of the proximity effect and the long-range fogging exposure, respectively. These parameters and functions are experimentally obtained beforehand.

The spread of the proximity effect $\sigma(x)$ is about 10 $\mu$m whereas that of the long-range fogging exposure $p(x)$ is about several millimeters.

The proximity effect and the long-range fogging exposure can be corrected with the following equations:

$$0.5DC_p(x)DC_f(x)+\eta DC_f(x)\int \sigma(x-x')DC_p(x')dx' + \qquad (10)$$
$$\theta \int p(x-x')DC_p(x')DC_f(x')dx' = 0.5D_0$$

which is an approximate expression of the equation (9).

The equation (9) is established under the condition that variation in the radiation amount $DC_f(x)$ for correcting the long-range fogging exposure is milder than that in the radiation amount $DC_p(x)$ for correcting the proximity effect in the equation $D(x)=DC_p(x)\times DC_f(x)$.

The radiation amount $DC_p(x)$ for correcting the proximity effect and the radiation amount $DC_f(x)$ for correcting the long-range fogging exposure are decided so that they satisfy the following equations:

$$0.5DC_p(x)+\eta\int\sigma(x-x')DC_p(x')dx'=0.5 \qquad (11)$$

$$0.5DC_f(x)+\theta\int p(x-x')DC_p(x')DC_f(x')dx'=0.5D_0 \qquad (12)$$

The integration in the equation (12) will not produce large errors even under the condition that the radiation amount $DC_f(x)$ is constant over a 1-mm-square region.

The term involving integration in the equation (12) for the 1 mm-square region is given as follows:

$$\theta\Sigma p(x-x_j)DC_f(x_j)\int_j DC_p(x')dx'$$

where "j" denotes a region, $\int_j$ gives the integration within the region j, and the term involving integration in the equation (12) is expressed as addition of terms each involving integration for one region.

Integration of the both sides of the equation (11) with the 1-mm-square pattern region gives integration of the second term in the equation (1) the following double two-dimensional spatial integration:

$$\int_j\int\sigma(x-x')DC_p(x')dx'dx \text{ which is approximated to } \int_j DC_p(x')dx', \text{ like the former procedure.}$$

The 1-mm-square integral region at "x'" gives the following equation:

$$(0.5+\eta)\int_j DC_p(x')dx'=0.5\times(\text{patterning area in region j})$$

which further gives the following equation:

$$\int_j DC_p(x')dx'=(\text{patterning area in region j})/(0.5+\eta)$$

Then, the equation (12) is converted into the following equation (13) for a region (i):

$$0.5DC_f(x_i)+\theta/(0.5+\eta)\Sigma p(x_i-x_j)DC_f(x_j)\times(\text{patter in region i})=0.5D_0 \qquad (13)$$

The equation (13) is applied to all regions over the mask surface to obtain $DC_f(x_i)$.

The total sum $\Sigma$ in the equation (13) not all regions but only for regions within a radius of 30 mm from a region including "$X_i$" makes easy the total calculation. This is because the mask is large enough against the spread of q(x).

In the method disclosed so far, $DC_f(X_i)$ requires no fine pattern distributions required for proximity-effect correction if the parameters $\theta$ and $\eta$ indicating the proximity effect and long-range fogging exposure, respectively, and also a pattering area of each region are given.

The proximity effect and the long-range fogging exposure can be corrected by the following procedure: a radiation amount $DC_f(x)$ for correcting the long-range fogging exposure is obtained beforehand; and a radiation amount $DC_p(x)$ for correcting the proximity effect in regions near sub-writing regions is calculated at exposure, which is then multiplied by $DC_f(x)$ in the sub-writing regions.

A radiation amount for correcting the loading effect is obtained next.

Approximation is made to pattern-size variation so that it depends not on pattern shape but pattern density. The grid same as the one used for correction of the long-range fogging exposure is preferable for the pattern-density distribution for simplified system architecture.

Figure 7:
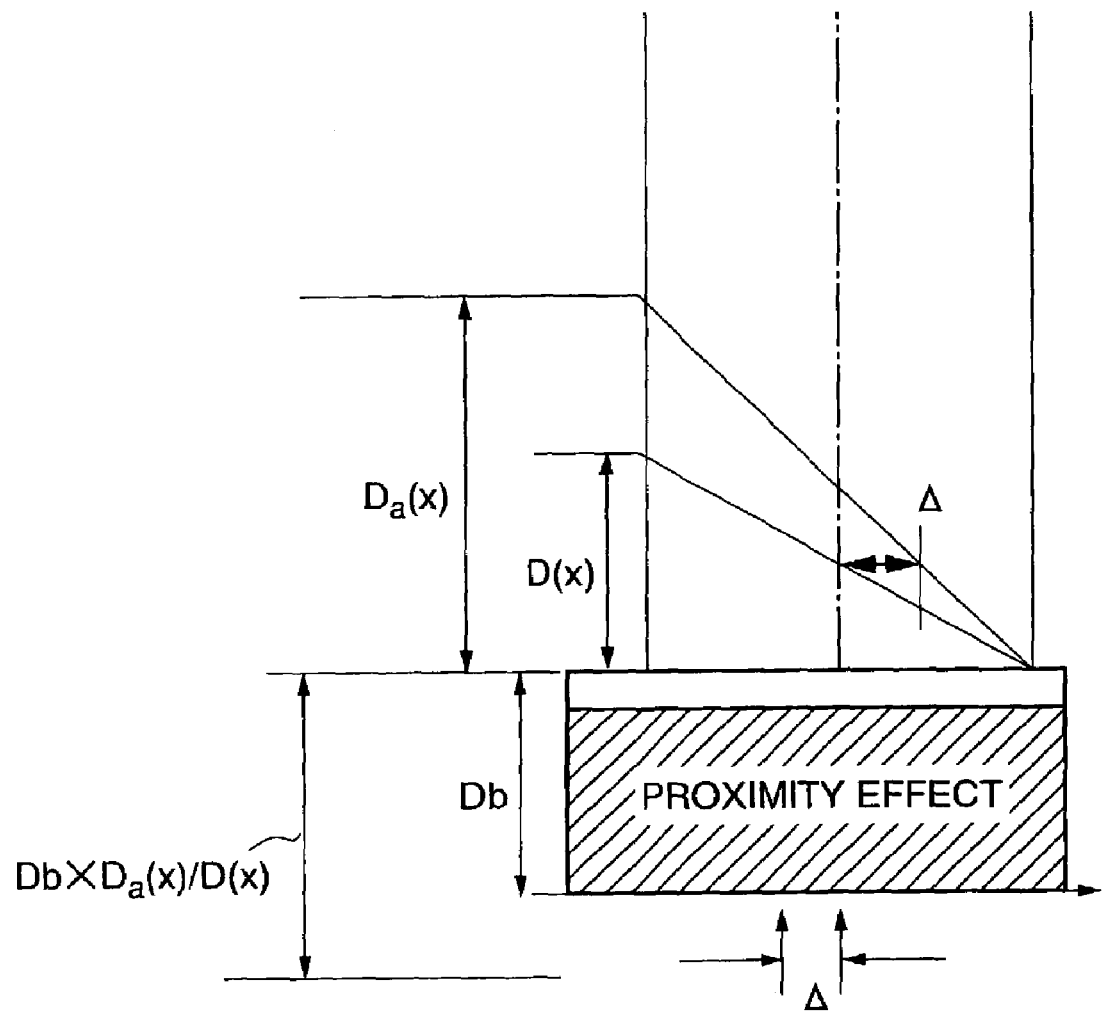
FIG. 7 is an illustration of a method of correcting the loading effect in an embodiment according to the present invention.

It is assumed in FIG. 4 that all patterns vary by $\Delta$ in size. The amount of beam radiation is adjusted, as illustrated in FIG. 7, to correct the pattern-size variation.

For the fine pattern zone B in FIG. 4, an amount of radiation before correction of the loading effect, an effective amount of radiation in background exposure due to the proximity effect and the long-range backscatter and an amount of radiation after correction of the loading effect are expressed as $D(x)$, Db and $Da(x)$, respectively.

The radiation amount in background exposure is approximated to $Db\times Da(x)/D(x)$.

The effective amount of radiation in background exposure Db is given as follows:

$$Db=0.5(D_0-D(x)) \qquad (15)$$

Therefore, the radiation amount $Da(x)$ after correction of the loading effect selected so as to satisfy the following equation (16) allows variation of $-\Delta$ for the size of resist after development.

$$Da(x)\times(w-\Delta)/2w+Db\times Da(x)/d(x)=0.5D_0 \qquad (16)$$

The pattern-size variation $\Delta$ due to etching and the resist-size variation $-\Delta$ balance out to obtain a required pattern size for post-etching.

The term $0.5D_0$ in the equation (16) is expressed as $0.5D_0=0.5D(x)+Db(x)$, which is applied to the equation (16) to give the following equation:

$$Da(x)=D(x)/(1-(\Delta/w)\times D(x)/D_0) \qquad (17)$$

Beam radiation at the amount $Da(x)$ provides a required pattern size for post-etching.

The dependency of pattern-size variation $\Delta$ due to etching on pattern density is given through etching resist patterns of different pattern densities.

Although the simplest linear distribution is employed as the effective radiation amount distribution in FIG. 7, another type of distribution is of course be employed.

For example, it is assumed that a pattern edge "u" is zero in one dimension. Also it is assumed that the radiation distribution is given as $D(x)s(u)$ where $s(0)=0.5$, $s(\infty)=0$ and $s(-\infty)=1$.

The following equations are given in the method already disclosed under these assumptions.

$$(Da(x)/D(x))\times Db(x)+Da(x)s(\Delta)=0.5D_0 \qquad (18)$$

$$Da(x)=D(x)/(1+(2s(\Delta)-1)\times(D(x)/D_0)) \qquad (19)$$

Spot-beam energy distribution $s(\Delta)$ applied to a resist can be experimentally obtained with the dependency of variation in resist pattern size on the amount of beam radiation. For example, the distribution $s(\Delta)$ can be obtained with parameters given through test pattern exposure using an adequate function such as an error function.

Provided is an array of rectangular patterns separated from one another at regular intervals. A region sufficiently lager than that affected by the proximity effect but smaller than that affected by the loading effect, for example, a 200-micron-square zone is set in the center region of the array.

Straight patterns of different densities are formed in an about 100-micron zone in the center region of the array, with correction of the proximity effect and the long-range scatter exposure.

A typical value of developed pattern-size variation is set to a pattern-size variation $\Delta$ due to the loading effect against the peripheral pattern density. It is preferably set to a pattern-size variation Δ averaged near the most important density for the center pattern.

Figure 9:
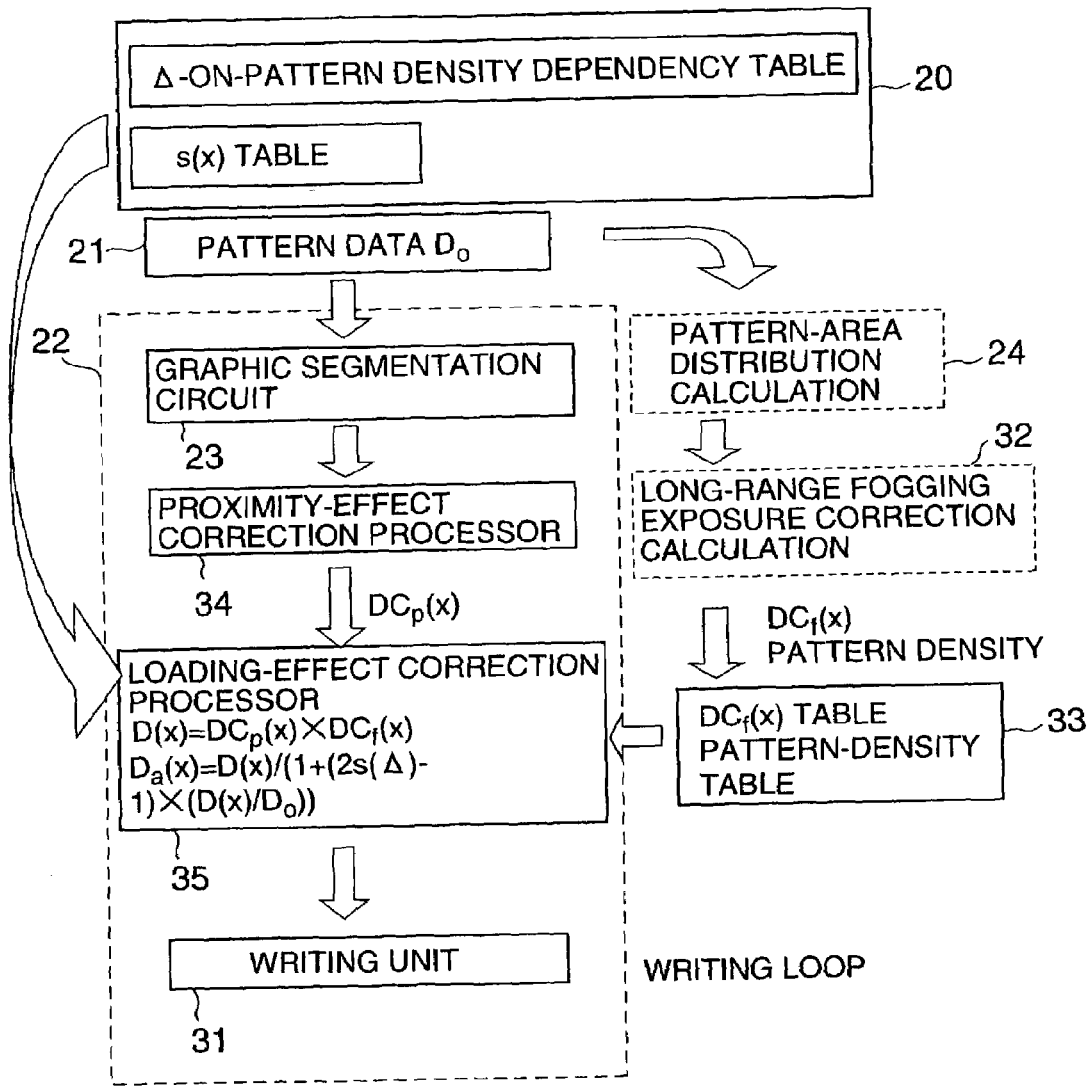
FIG. 9 is a flowchart of procedures in an embodiment according to the present invention.

FIG. 9 shows a system architecture to achieve the correction procedure disclosed above. Elements in FIG. 9 that are the same as or analogous to the elements shown in FIG. 8 are referenced by the same reference numerals.

Stored first in the system memory 20 is a table of dependency of pattern-size variation Δ due to the loading effect on pattern density and another table of functions s(x) indicating energy-beam distribution, which have been obtained through experiments or simulation.

Stored next in the memory 21 of the data processor are pattern data and a reference radiation amount $D_0$.

The pattern data stored in the memory 21 are supplied to the calculator 21. The entire writing region is divided into 1-mm-square sub-writing regions and pattern-area density is obtained per 1-mm-square sub-writing region by the calculator 21 based on the pattern data stored in the memory 21.

A radiation amounts $DC_f(x)$ for correcting the long-range fogging exposure per 1-mm-square sub-writing region at a reference radiation amount $D_0$ is obtained by a calculator 32 using the equation (13), based on the pattern-area density in each sub-writing region. A table of radiation amounts $DC_f(x)$ is stored in a memory 33.

On writing, the pattern data are retrieved from the memory 21 and sent to the graphic segmentation circuitry 23 of the writing system 22, for segmentation of patterns to be written.

A proximity-effect correction processor 34 obtains radiation amount $DC_p(x)$ for correcting the proximity effect at the reference radiation amount $D_0$ using the equation (11), based on the pattern data to be used near each sub-writing region.

Next, a loading-effect correction processor 35 performs the following procedures:

retrieving data on radiation amount $DC_f(x)$ for correcting the long-range fogging exposure corresponding to each sub-writing region from the memory 33, to obtain $D(x)=DC_p(x)DC_f(x)$;

retrieving pattern-size variation Δ due to the loading effect corresponding to pattern density from the memory 20;

obtaining spot-beam energy distribution s(Δ) using the table of the function s(x) indicating the energy-beam distribution stored in the memory 20; and obtaining a radiation amount $Da(x)=D(x)/(1+(2s(\Delta)-1)\times(D(x)/D_0))$, the amount D(x) being sent to the writing unit 31.

The writing unit 31 performs a writing procedure in accordance with the radiation amount Da(x). The above procedures are repeated for all sub-writing regions.

The data on the tables are discrete. Hence, interpolation is effective in obtaining the pattern-size variation Δ due to the loading effect and the spot-beam energy distribution s(Δ) based on the tables.

The pattern density may be obtained during exposure based on pattern data on a zone that is a little bit ahead of the current zone under exposure, instead of previously obtaining the radiation amount $DC_f(x)$ for correcting the long-range fogging exposure. The almost parallel procedures of pattern-density calculation and exposure achieve decrease in processing time.

The methods disclosed so far are limited to correction of the loading effect. Not only that, however, the present invention is applicable to correction of pattern-size variation due to other causes in addition to the loading effect.

For example, an etching speed will vary little bit against an ideal etching speed constant over a target. It is assumed that a pattern-size variation due to unstable etching speed is given not by pattern density but the pattern-size variation Δ.

This assumption allows pattern-size adjustments using the equation (10). In detail, distribution data on the pattern-size variation are previously listed on a table or fit in the form of equation and stored in a memory. The stored data are then used to obtain pattern-size variation Δ in calculating the beam-spot energy distribution s(Δ) applied to a resist, for calculating the amount of correction in pattern-size adjustments.

Figure 10:
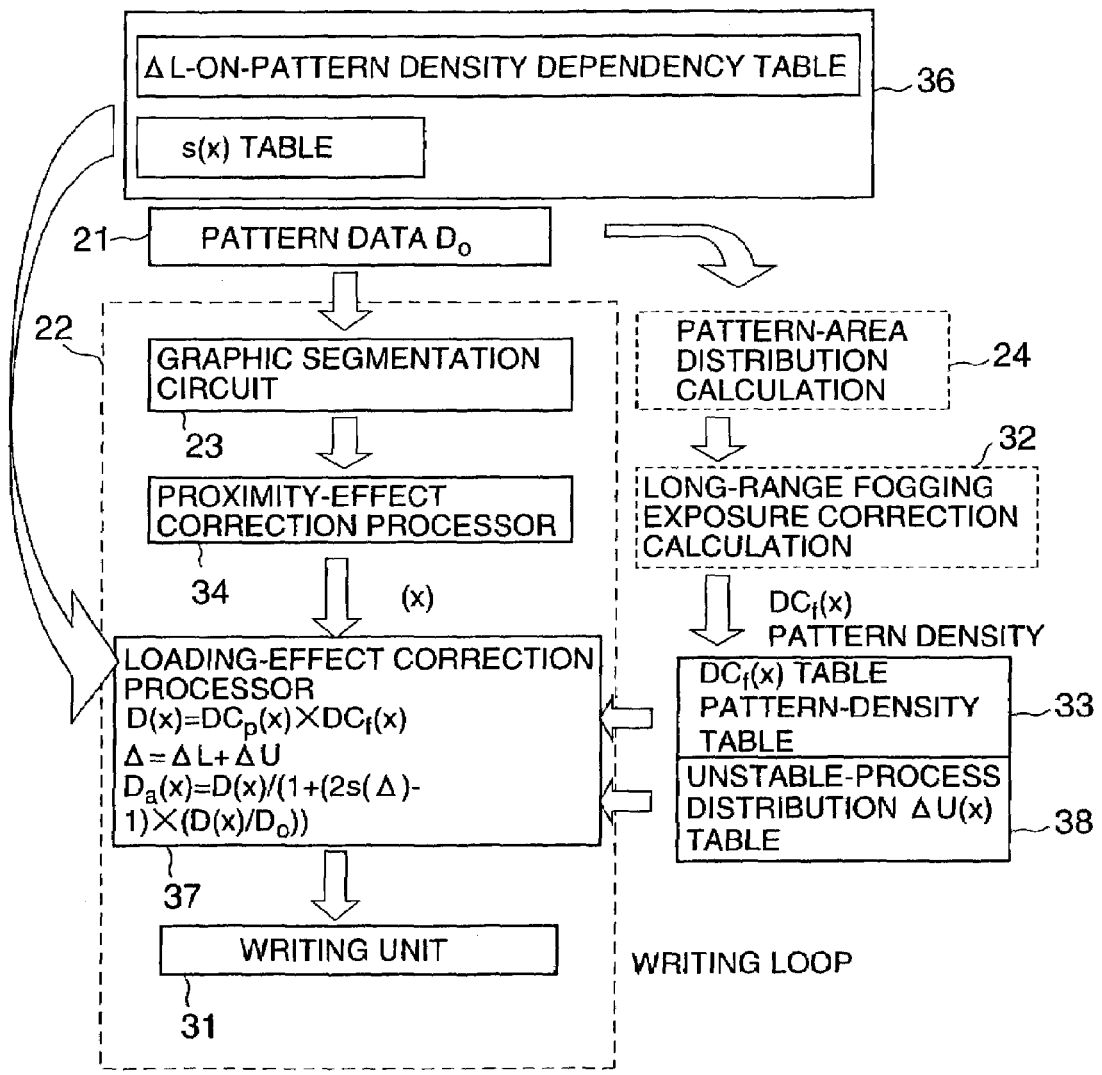
FIG. 10 is a flowchart of procedures in an embodiment according to the present invention.

Next, a writing system shown in FIG. 10 is available when the loading effect and etching are both unstable. In this system, the effects of loading effect and etching are examined beforehand. A sum of the pattern-size variation distribution ΔL due to the loading effect and the pattern-size variation distribution ΔU due to the non-uniform etching (ΔL+ΔU) is set to Δ for the equation (10) to obtain a required pattern size.

The differences between the writing system shown in FIG. 10 and the counterpart in FIG. 9 are as follows:

The writing system in FIG. 10 is equipped with a memory 38 for storing the pattern-size variation distribution ΔU(x) due to unstable process obtained through experiments, etc.

Pattern-size variation distribution ΔL due to the loading effect is stored in a memory 36 (FIG. 10), that corresponds to the pattern-size variation Δ due to the loading effect in the memory 20 (FIG. 9).

Next, a loading-effect correction processor 37 performs the following procedures:

retrieving data on radiation amount $DC_f(x)$ for correcting the long-range fogging exposure to each sub-writing region and pattern density from the memory 33, and also data on the pattern-size variation distribution ΔU(x) due to unstable processing from the memory 38; and obtaining Δ(x) using the equation Δ(x)=ΔL(x)+ΔU(x) and then a correction amount of radiation Da(x) from s(Δ(x)), D(x) and a reference radiation amount $D_0$ based on Δ(x).

The sign "+" or "−" for "Δ" depends on whether a positive or a negative resist is used or etching-process requirements.

Figure 11:
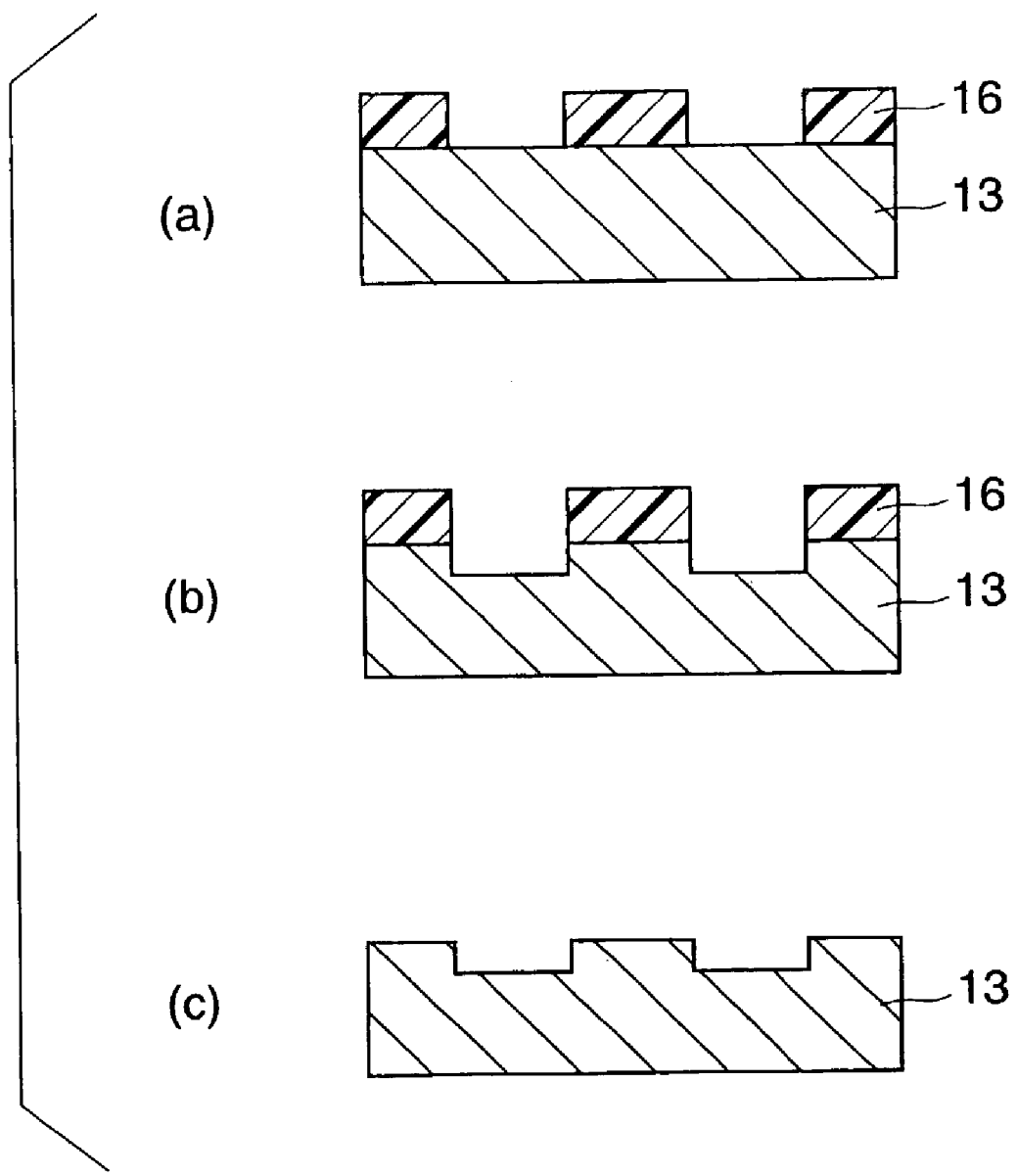
FIG. 11 shows cross sectional views for explaining a pattern forming method in an embodiment according to the present invention.

As illustrated in FIG. 11(a), patterns are written on a resist film 16 formed on a target 13, the film 16 being developed to form a resist pattern 16 thereon. The resist pattern 16 is a pattern for which the proximity effect, the long-range fogging exposure and also the loading effects have been corrected.

Next, as illustrated in FIG. 11(b), the target 13 is etched with the resist pattern 16 as a mask. The resist pattern 16 is then removed from the target 13 to form patterns thereon for which etching-induced pattern-size variation has be been corrected at high accuracy, as illustrated in FIG. 11(c).

The methods disclosed above are further applicable to electron-beam pattern transfer. In detail, electron beams travel over a patterned mask continuously while being on or step by step while being alternately turned on and off. Then, the patterned electron beams radiate onto a target to form patterns thereon.

Adjustments to electron-beam current density or radiation time vary radiation amount on a target to correct pattern-size variation. Overlapped beam spots in step-by-step electron-beam movements offer continuity of patterns formed on a target.

The electron-beam pattern transfer is, however, disadvantageous in that patterns are transferred on limited small regions on a target such as a wafer. And hence, the long-range fogging exposure, the loading effect or the process non-uniformity could occur in a region wider than patterns formed with one mask pattern. Such disadvantage is overcome by involving the effects of patterns surrounding a current pattern to be formed into correction-amount calculation disclosed so far.

Not only electron beams disclosed above, but also other energy beams such as laser beams can be used in the present invention. The proximity effect and the long-range fogging exposure will be mainly caused by unfocused laser beams or leaked beams in the laser optical system while the process-induced pattern-size variation being the same in use of electron beams. Laser beams can be turned on and off through an optoacoustic device, etc. The beam-on time is then varied to adjust the density of radiated laser beams for correction of pattern-size variation.

As disclosed above in detail, the present invention achieves high accuracy in correction of etching-induced pattern-size variation.

What is claimed is:

1. A pattern writing method for radiating an energy beam on a resist that is applied to a target to write patterns thereon comprising:
    storing pattern data for writing the patterns, the pattern data including a reference radiation amount $D_0$ for radiating the energy beam, a distribution of a pattern dependency of a pattern-size variation $\Delta$ due to a loading effect, and an energy distribution "s" applied to the resist by the energy beam;
    dividing writing regions of the target into grids to provide sub-writing regions in the grids;
    obtaining a distribution of a pattern-area density per sub-writing region based on the pattern data;
    calculating a radiation amount $DC_f(x)$ for correcting a long-range fogging exposure in each sub-writing region based on the pattern-area density and the reference radiation amount $D_0$;
    calculating a radiation amount $DC_p(x)$ for correcting a proximity effect applied to those of the patterns in each sub-writing region based on the pattern data and the reference radiation amount $D_0$;
    calculating a radiation amount $D(x)$ based on the radiation amount $DC_f(x)$, the radiation amount $DC_p(x)$, the distribution of a pattern dependency, and the energy distribution "s";
    deciding a radiation locations and a radiation shape of the energy beam based on data on a pattern location and a pattern shape for each of the patterns in the sub-writing regions; and
    radiating the energy beam on the radiation location on the target with the radiation shape for a period in which a radiated energy level from the energy beam reaches the radiation amount $D(x)$.

2. The pattern writing method according to claim 1 further comprising:
    obtaining a distribution of a pattern-size variation $\Delta(x)$ per sub-writing region based on the distribution of the pattern-area density and the distribution of the pattern dependency of the pattern-size variation $\Delta$ due to the loading effect;
    wherein the step of calculating the radiation amount $DC_f(x)$ is calculated based on the distribution of the pattern-area density, the reference radiation amount $D_0$, and the distribution of the pattern-size variation $\Delta(x)$;
    wherein the step of calculating the radiation amount $DC_p(x)$ is calculated based on the data on the pattern location and the pattern shape in the sub-writing regions, the reference radiation amount $D_0$, the distribution of the pattern-size variation $\Delta(x)$, and the energy distribution "s" of the energy beam.

3. The pattern writing method according to claim 1, wherein the step of calculating the radiation amount $D(x)$ includes generating a product of the radiation amount $DC_f(x)$ and the radiation amount $DC_p(x)$.

4. The pattern writing method according to claim 3, wherein the step of calculating the radiation amount $D(x)$ uses the radiation amount $DC_f(x)$ set to the reference radiation amount $D_0$.

5. The pattern writing method according to claim 1, wherein the step of calculating the radiation amount $D(x)$ uses an equation $D(x)=DC_p(x) \times DC_f(x)/(1+(2s(\Delta)-1) \times (DC_p(x) \times DC_f(x)/C_0))$.

6. The pattern writing method according to claim 5, wherein the pattern-size variation $\Delta$ involves a non-uniform etching in addition to the loading effect.

7. The pattern writing method according to claim 5, wherein the step of calculating the radiation amount $D(x)$ uses the radiation amount $DC_f(x)$ set to the reference radiation amount $D_0$.

8. A pattern forming method comprising:
    storing pattern data for writing patterns, the pattern data including a reference radiation amount $D_0$ for radiating an energy beam on a resist-applied target, a distribution of a pattern dependency of a pattern-size variation $\Delta$ due to a loading effect, and an energy distribution "s" applied to the resist by the energy beam;
    dividing writing regions of the target into grids to provide sub-writing regions in the grids;
    obtaining a distribution of a pattern-area density per sub-writing region based on the pattern data;
    calculating a radiation amount $DC_f(x)$ for correcting a long-range fogging exposure in each sub-writing region based on the pattern-area density and the reference radiation amount $D_0$;
    calculating a radiation amount $DC_p(x)$ for correcting a proximity effect applied to those of the patterns in each sub-writing region based on the pattern data and the reference radiation amount $D_0$;
    calculating a radiation amount $D(x)$ based on the radiation amount $DC_f(x)$, the radiation amount $DC_p(x)$, the distribution of a pattern dependency, and the energy distribution "s";
    deciding radiation locations and radiation shapes of the energy beam based on data on pattern locations and pattern shapes of the patterns in the sub-writing regions and radiating the energy beam on the radiation locations on the target with the radiation shapes for a period in which a radiated energy level from the energy beam reaches the radiation amount $D(x)$, thus writing the patterns on the resist;
    developing the pattern-written resist to form a resist pattern; and
    etching the target with the resist pattern as a mask, thus forming the patterns on the target.

9. The pattern forming method according to claim 8 further comprising:
    obtaining a distribution of pattern-size variation $\Delta(x)$ per sub-writing region based on the distribution of the pattern-area density and the distribution of the pattern dependency of pattern-size variation $\Delta$ due to the loading effect;
    wherein the step of calculating the radiation amount $DC_f(x)$ is calculated based on the distribution of the pattern-area density, the reference radiation amount $D_0$, and the distribution of the pattern-size variation $\Delta(x)$;

wherein the step of calculating the radiation amount $DC_p(x)$ is calculated based on the data on the pattern locations and the pattern shapes in the sub-writing regions, the reference radiation amount $D_0$, the distribution of the pattern-size variation $\Delta(x)$, and the energy distribution "s" of the energy beam.

10. The pattern forming method according to claim 8, wherein the step of calculating the radiation amount $D(x)$ includes generating a product of the radiation amount $DC_f(x)$ and the radiation amount $DC_p(x)$.

11. The pattern forming method according to claim 10, wherein the step of the radiation amount $D(x)$ uses the radiation amount $DC_f(x)$ set to the reference radiation amount D.

12. The pattern forming method according to claim 8, wherein the step of calculating the radiation amount $D(x)$ uses an equation $D(x)=DC_p(x) \times DC_f(x)/(1+(2s(\Delta)-1) \times (DC_p(x) \times DC_f(x)/C_0))$.

13. The pattern forming method according to claim 12, wherein the pattern-size variation $\Delta$ involves a non-uniform etching in addition to the loading effect.

14. The pattern forming method according to claim 12, wherein the step of calculating the radiation amount $D(x)$ uses the radiation amount $DC_f(x)$ set to the reference radiation amount $D_0$.

* * * * *